United States Patent [19]

Jones

[11] Patent Number: 4,704,872
[45] Date of Patent: Nov. 10, 1987

[54] THERMALLY CONTROLLED T/R MODULE TEST APPARATUS

[75] Inventor: Edward J. Jones, Rome, N.Y.

[73] Assignee: The United States of America as represented by the Secretary of the Air Force, Washington, D.C.

[21] Appl. No.: 934,585

[22] Filed: Nov. 25, 1986

[51] Int. Cl.⁴ .......................................... F25B 21/02
[52] U.S. Cl. ........................................................ 62/3
[58] Field of Search ............................................... 62/3

[56] References Cited

U.S. PATENT DOCUMENTS

| | | | | |
|---|---|---|---|---|
| 3,321,953 | 5/1967 | Roveti | | 73/15 |
| 4,172,993 | 10/1979 | Leach | | 324/158 F |
| 4,324,285 | 4/1982 | Henderson | | 165/2 |
| 4,593,529 | 6/1986 | Birochik | | 62/3 |
| 4,622,822 | 11/1986 | Beitner | | 62/3 |

Primary Examiner—Lloyd L. King
Attorney, Agent, or Firm—William Stepanishen; Donald J. Singer

[57] ABSTRACT

A thermally controlled T/R module test apparatus utilizing a multi-stage thermoelectric cooling module to maintain a T/R module at predetemined temperature during test measurements. The thermoelectric cooling module provides a cooling capacity of 9 watts and a temperature differential of 80° centigrade which allows the T/R module to be thermally cycled during the test measurements.

7 Claims, 2 Drawing Figures

THERMALLY CONTROLLED T/R MODULE TEST APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a thermal test fixture, and in particular to a thermally controlled T/R module test apparatus.

The state of the art of thermally controlled test apparatus is well represented and alleviated to some degree by the prior art apparatus and approaches which are contained in the following U.S. Patents:

U.S. Pat. No. 3,321,953 issued to Roveti on 30 May 1967;

U.S. Pat. No. 4,172,993 issued to Leach on 30 Oct. 1979; and

U.S. Pat. No. 4,324,285 issued to Henderson on 13 Apr. 1982.

The Roveti reference discloses an apparatus for thermal testing transistors in situ comprising a generally pistol-shaped housing supporting at the muzzle end a fixed hook-shaped member and a movable hook-shaped member surrounding a transistor. This adjusts the turns ratio of the transformer and determines the amount of current which will flow through the members. The push button is then depressed until the contacts are closed to energize the transformer. Current flows through the members heating them. Of course, the members may be indirectly heated by imbedded heating elements, if desired. As the members and the transistor heat, the current flowing through the thermistors changes, and these changes are shown on the meter. When the temperature of the system including the transistor has stabilized, as shown by no further changes in the reading of the meter, the transistor and the circuit in which it is connected is tested for operation by injecting a signal (shaped pulse or otherwise) into the input of the system containing the transistor, and observing the size and shape of the signal at the output of the system. The effects of temperature can thereby be seen.

The Leach reference describes an environmental hood for testing printed circuit cards. In order to permit probing access to a printed circuit board while the printed circuit board is under test in a cold controlled environment, a doubled walled environmental hood is provided, the inner and outer walls spaced apart by rings containing orifices therein, a probe hole formed in the center of the ring and the outer wall cut away in the area of the ring, with a cold gas supplied to the inside of the inner wall and a hot gas supplied to the space between the walls, whereby the hot gas escaping through the orifices in the rings will raise the temperature of the cold gas, escaping from the probe hole to prevent frosting and permit viewing of the printed circuit board under test for probing.

The Henderson patent illustrates an apparatus for heating and cooling devices under test which comprises a high temperature probe and a low temperature probe, with each probe adapted to make thermal contact with a microelectronic device under test for sequentially heating the device first to a preselected high temperature and then cooling the device to a preselected low temperature. A control system is provided, connected to each of the probes by a small diameter, flexible cable. Each probe is a small, box-like structure having a heat sink, and a heat-sensing diode embedded in the heat sink. The control system senses the heat sink temperature and controls current through the heater to maintain the heat sink at a preselected temperature. The high temperature probe is placed on the top surface of a device under test and serves to add heat quickly thereto to bring the device to a preselected temperature above ambient. The low temperature probe includes a reservoir in contact with its heat sink for holding chips of dry ice, and when the latter probe is placed on the top surface of a device under test, the sublimating dry ice removes heat from the device. The heater portion of the low temperature probe serves to add heat to its heat sink when the device tends to become cooler than a preselected below-ambient temperature. An indicator is utilized to read the heat sink temperature of the probe in use at a given instant.

SUMMARY OF THE INVENTION

The present invention utilizes a thermally controlled T/R module test fixture (TCMF) that is a self-contained microwave test fixture for convenient, accurate testing and characterizing transmit/receive (T/R) modules which are being thermally cycled. The thermally controlled T/R module test fixture comprises a multi-stage thermoelectric cooling module which provides an 80 degree centigrade temperature differential and is mounted to an adjustable test support that is capable of holding in place a monolithic microwave integrated circuit (MMIC) transmit/receive module. The thermally controlled T/R module test fixture can be used in numerous automated measurement test systems for acquiring MMIC T/R module data as a function of thermal cycling such as s-parameters and noise figure.

It is one object of the present invention, therefore, to provide an improved thermally controlled T/R module test apparatus.

It is yet another object of the present invention to provide an improved thermally controlled T/R module wherein total testing cost of MMIC T/R modules will be lower.

It is still a further object of the present invention to provide an improved thermally controlled T/R module test apparatus wherein microwave performance of MMIC T/R modules can be easily attained as a function of thermal cycling without the use of large and costly thermal test chambers.

It is still another object of the present invention to provide an improved thermally controlled T/R module wherein no package de-embedding calibration is required and thus more accurate MMIC T/R module test data is attained.

It is yet another object of the present invention to provide an improved thermally controlled T/R module wherein it can be used with a broad variety of measurement systems.

It is an even further object of the present invention to provide an improved thermally controlled T/R module which allows quick insertion and removal of the unit under test.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
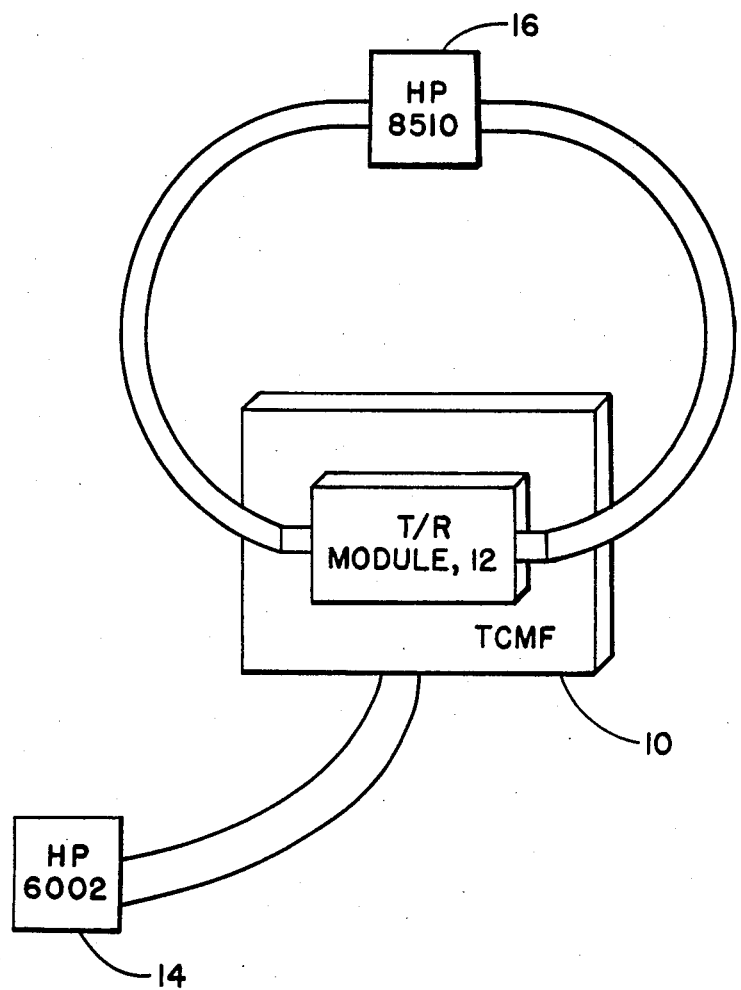
FIG. 1 is a block diagram of the thermally controlled T/R module test apparatus using a network analyzer to test a T/R module.

Referring now to FIG. 1 there is shown in block diagram of the thermally controlled T/R module test apparatus 10. The T/R module 12 which is the unit under test is positioned on the thermally controlled T/R module test apparatus 10. The microwave performance of the T/R module 12 is to be evaluated while the module undergoes thermal cycling. The thermally controlled T/R module test apparatus provides a multi-stage thermal electric cooling module which is capable of providing an 80° C. temperature differential. The thermally controlled T/R module test apparatus receives its input power from power supply unit 14. The power supply unit 14 may comprise any suitable commercially available power supply unit such as the Hewlett Packard power supply model HP6002. A network analyzer unit 16 is connected to the T/R module 12 to measure its microwave characteristics while the unit undergoes thermal cycling. The network analyzer unit 16 may comprise any suitable commercially available analyzer unit such as the Hewlett Packard network analyzer model HP8510. The thermally controlled T/R module test apparatus may be used in numerous automated measurement test systems for acquiring T/R module data such as S-parameters and noise figure which may be determined as a function of thermal cycling.

Figure 2:
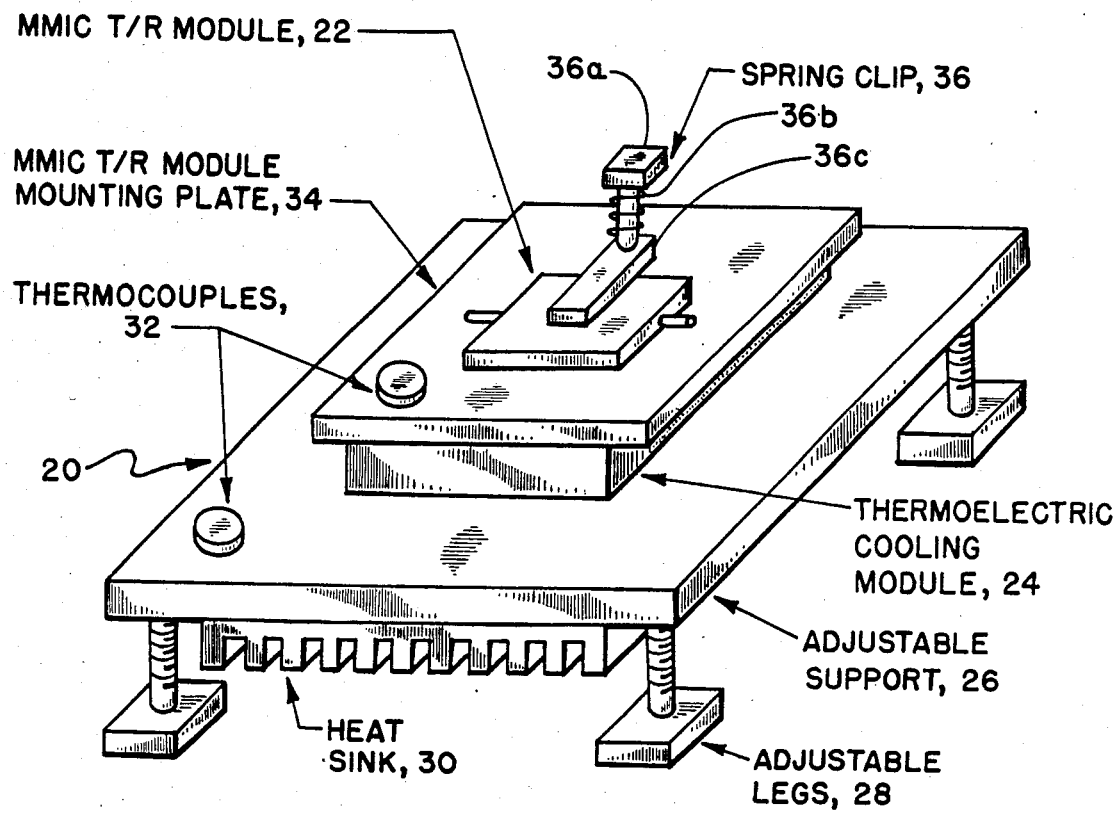
FIG. 2 is a perspective view of the thermally controlled T/R module test apparatus according to the present invention.

Turning now to FIG. 2 there is shown a thermally controlled T/R module test apparatus 20 that will vary the environmental temperature of the monolithic microwave integrated circuit (MMIC) T/R module unit 22 which is being tested while being thermally cycled. The thermally controlled T/R module test apparatus 20 comprises a thermoelectric cooling module 24, an adjustable support member 26 and a T/R module mounting plate 34. The thermoelectric cooling module 24 comprises a multi-stage thermoelectric cooling unit which, when a current is applied to it, will remove heat from its top surface (cool this surface) and accumulate heat on its bottom surface (heating this surface). The thermoelectric cooling module 24 is positioned on the top surface of the adjustable support member 26. The thermoelectric cooling module 24 may be fastened if required to the adjustable support member 26 either directly or indirectly. A T/R module mounting plate 34 is positioned on the top surface of the thermoelectric cooling module 24. The T/R module mounting plate 34 may be used to fasten the thermoelectric cooling module 24 to the adjustable support member 26. This may be accomplished by utilizing screws or bolts between the T/R module mounting plate 34 and the adjustable support member 26 to secure the thermoelectric cooling module 24 in place.

The T/R module mounting plate 34, in addition to being a means for securing or holding the MMIC T/R module unit 22 in place during thermally cycled testing, provides a means for conducting heat to or away from the T/R module unit 22. The T/R module mounting plate 34 includes a spring clip means 36 as a securing means for the T/R module 22. The spring clip means 36 may comprise any suitable conventional holding apparatus such as shown. The spring clip means 36 comprises a T-handle member 36a, a spring 36b and a holding member 36c which may be a bar, rod or other suitable straining means. The T-handle member 36a passes through an opening in holding member 36c which allows relative movement between the members. The T-handle member 36a has one end attached to the T/R module mounting plate. The spring 36b is positioned on the T-handle member 36a between the T-portion of the T-handle member and in contact with the holding member 36c. The spring 36b exerts sufficient force upon the holding member 36c to enable it to maintain the T/R module 22 in a fixed position on the T/R module mounting plate 34. A pair of thermocouple units 32 are respectively positioned on the T/R module mounting plate 34 and the adjustable support member 26 to provide an indication of the temperature of each surface. The thermocouple units 32 have a temperature measuring range up to 150° C.

The adjustable support member 26 provides a support platform for the thermoelectric cooling module 24. The adjustable support member 26 has adjustable legs 28 attached thereto to provide a means of leveling and stabilizing the adjustable support member 26. Any suitable number of adjustable legs 28 may be utilized to accomplish the stated function. There is attached to the bottom side of the adjustable support member 26, a heat sink 20. The heat sink 20 which may comprise any suitable heat sink material such as aluminum, may be attached to the adjustable support member 26 in any suitable conventional manner, such as with bolts or screws. The heat sink 30 is utilized to draw excess heat away from the adjustable support member 26 which may comprise any suitable heat conducting material such as copper.

The thermally controlled T/R module test apparatus 20 is comprised of an adjustable support (which also acts as heat sink), a multi-stage thermoelectric cooling module, and a MMIC T/R module mounting plate. The multi-stage thermoelectric cooling module has a cooling capacity of 9 watts, and a temperature difference between the hot and cold surface of 80 degrees centigrade. An example of a suitable thermoelectric cooling module is commercially available from the Midland-Ross Corporation of Cambridge, Massachusetts under the model number 801-1003-01-00-00. The adjustable support member 26 which may be made of a copper plate, may utilize ¼ inch bolts to provide the adjustable function of the legs 28. The MMIC T/R module mounting plate 34 may also be made of copper plate. Both the MMIC T/R module mounting plate 34 and the adjustable support member 26 each have a thermocouple unit positioned thereon and attached thereto that can be used to measure the surface temperature of each and thereby the temperature differential therebetween. The thermocouple unit 32 may comprise any suitable conventional device with a temperature range up to 150° C. An example of such a thermocouple unit is commercially available from Omega Engineering Incorporated of Stanford, Connecticut under the part number C01-T.

The present invention as described above is a unique test apparatus that is designed specifically for testing MMIC T/R modules in a thermal cycling environment. This apparatus provides a convenient and cost effective approach for MMIC T/R module test fixturing, which will drive overall MMIC T/R module testing cost down. The thermally controlled T/R module test apparatus is designed to accommodate several different MMIC T/R module packages and is not limited as far as different types of microwave connectors are concerned.

Although the invention has been described with reference to a particular embodiment, it will be understood to those skilled in the art that the invention is capable of a variety of alternative embodiments within the spirit and scope of the appended claims.

What is claimed is:

1. A thermally controlled T/R module test apparatus for a testing T/R module during thermal cycling comprising in combination:
    means for thermoelectric cooling, said thermoelectric cooling means generating a temperature differential of 80° centigrade,
    means for support, said support means being adjustable to provide a stable platform, said thermoelectric cooling means positioned atop said support means, and,
    a mounting plate positioned atop said thermoelectric cooling means, said mounting plate including a means for holding, said holding means securing said T/R module to said mounting plate, said thermoelectric cooling means drawing excess heat from said mounting plate and said T/R module to maintain it at some predetermined temperature during test measurements, said thermoelectric cooling means transferring said excess heat to said support means for dissipation.

2. A thermally controlled T/R module test apparatus as described in claim 1 further including a finned heat sink, said heat sink mounted to the bottom of said support means to dissipate said excess heat therefrom.

3. A thermally controlled T/R module test apparatus as described in claim 2 wherein said thermal cooling means provides a cooling capacity of 9 watts.

4. A thermally controlled T/R module test apparatus as described in claim 2 wherein said support means comprises a copper plate.

5. A thermally controlled T/R module test apparatus as described in claim 2 wherein said mounting plate comprises a copper plate.

6. A thermally controlled T/R module test apparatus as described in claim 2 further including a first thermocouple unit, said first thermocouple unit is positioned atop said mounting plate and a second thermocouple unit, said second thermocouple unit is positioned atop said support means, said first and second thermocouple units measuring temperatures up to 150° C.

7. A thermally controlled T/R module test apparatus as described in claim 2 wherein said holding means comprises in combination:
    a T-handle member fastened at one end to said mounting plate,
    a support member with an opening therein, said T-handle member passing through said opening in said support member to allow relative movement therebetween, and,
    a spring positioned around said T-handle member between said support member and the T-portion of said T-handle member, said spring exerting a force on said support member to maintain said T/R module in place.

* * * * *